US010676817B2

(12) United States Patent
Wang et al.

(10) Patent No.: US 10,676,817 B2
(45) Date of Patent: *Jun. 9, 2020

(54) FLIP EDGE SHADOW FRAME

(75) Inventors: Qunhua Wang, San Jose, CA (US);
Soo Young Choi, Fremont, CA (US);
Robin L. Tiner, Santa Cruz, CA (US);
John M. White, Hayward, CA (US);
Gaku Furuta, Sunnyvale, CA (US);
Beom Soo Park, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 976 days.

This patent is subject to a terminal disclaimer.

(21) Appl. No.: 13/569,064

(22) Filed: Aug. 7, 2012

(65) Prior Publication Data

US 2013/0263782 A1  Oct. 10, 2013

Related U.S. Application Data

(60) Provisional application No. 61/620,955, filed on Apr. 5, 2012.

(51) Int. Cl.
*C23C 16/04* (2006.01)
*C23C 16/458* (2006.01)
*C23C 14/04* (2006.01)

(52) U.S. Cl.
CPC .......... *C23C 16/042* (2013.01); *C23C 14/042* (2013.01); *C23C 16/4585* (2013.01)

(58) Field of Classification Search
CPC .............. C23C 16/4585; C23C 14/042; H01L 21/68728; H01L 21/68721
See application file for complete search history.

(56) References Cited

U.S. PATENT DOCUMENTS 6,355,108 B1 * 3/2002 Won et al. .................... 118/728
6,773,562 B1    8/2004 Inagawa et al.
(Continued)

FOREIGN PATENT DOCUMENTS

CN    1580883 A      2/2005
JP    2007314841 A *  12/2007
(Continued)

OTHER PUBLICATIONS

Chinese Office Action (with attached English translation) dated Sep. 24, 2014 for Application No. 201380000449.1.
(Continued)

*Primary Examiner* — Karla A Moore
*Assistant Examiner* — Margaret D Klunk
(74) *Attorney, Agent, or Firm* — Patterson + Sheridan LLP

(57) ABSTRACT

Device for processing a substrate are described herein. An apparatus for controlling deposition on a substrate can include a chamber comprising a shadow frame support, a substrate support comprising a substrate supporting surface, a shadow frame with a shadow frame body including a first support surface, a second support surface opposite the first surface, and a detachable lip connected with the shadow frame body. The detachable lip can include a support connection, a first lip surface facing the substrate, a second lip surface opposite the first lip surface, a first edge positioned over the first support surface, and a second edge opposite the first edge to contact the substrate.

15 Claims, 5 Drawing Sheets

(56) References Cited

U.S. PATENT DOCUMENTS

| | | | |
|---|---|---|---|
| 8,002,896 B2 | 8/2011 | Tanaka et al. | |
| 2004/0021410 A1* | 2/2004 | Stagnitto et al. | 313/407 |
| 2005/0266174 A1 | 12/2005 | Hou et al. | |
| 2006/0011137 A1* | 1/2006 | Keller | 118/720 |
| 2006/0207508 A1 | 9/2006 | Leung | |
| 2007/0065597 A1* | 3/2007 | Kaido et al. | 427/569 |
| 2011/0304086 A1* | 12/2011 | Liu et al. | 269/296 |
| 2012/0009798 A1* | 1/2012 | Maynard | B05D 1/32 438/758 |
| 2012/0164771 A1* | 6/2012 | Lee | C23C 16/042 438/34 |
| 2013/0228124 A1* | 9/2013 | Furuta | H01J 37/32559 118/720 |
| 2014/0251216 A1* | 9/2014 | Wang et al. | 118/721 |

FOREIGN PATENT DOCUMENTS

| | | |
|---|---|---|
| KR | 2004-0075180 A | 8/2004 |
| KR | 2007-0003172 A | 1/2007 |
| KR | 20050088827 A | 6/2011 |

OTHER PUBLICATIONS

Office Action for related application, Korean Patent Application No. 10-2013-7018289 dated Sep. 1, 2014.
International Search Report for related application PCT/US2013/032990 dated Jul. 23, 2013.
Official Letter dated Feb. 19, 2016 from China Patent Office for corresponding Chinese Patent Application No. 2013800004491.
Taiwan Office Action for Application No. 102109741 dated Aug. 25, 2016.

* cited by examiner

FLIP EDGE SHADOW FRAME

CROSS-REFERENCE TO RELATED APPLICATIONS

This application claims benefit of U.S. Provisional Patent Application Ser. No. 61/620,955, filed Apr. 5, 2012, which is herein incorporated by reference.

BACKGROUND OF THE INVENTION

1. Field of the Invention

Embodiments of the present invention generally relate to a shadow frame for use in a processing chamber.

2. Description of the Related Art

Modern semiconductor devices require the formation of features, such as OLEDs, transistors, and low-k dielectric films, by depositing and removing multiple layers of conducting, semiconducting and dielectric materials from a glass substrate. Glass substrate processing techniques include plasma-enhanced chemical vapor deposition (PECVD), physical vapor deposition (PVD), etching and the like. Plasma processing is widely used in the production of flat panel devices due to the relatively lower processing temperatures required to deposit a film and good film quality which can result from using plasma processes.

In general, plasma processing involves positioning a substrate on a support member (often referred to as a susceptor or heater) disposed in a vacuum chamber and forming a plasma adjacent to the upper exposed surface of the substrate. The plasma is formed by introducing one or more process gases into the chamber and exciting the gases with an electrical field to cause dissociation of the gases into charged and neutral particles. A plasma may be produced inductively, e.g., using an inductive RF coil, and/or capacitively, e.g., using parallel plate electrodes, or by using microwave energy.

During processing, the edge and backside of the glass substrate as well as the internal chamber components must be protected from deposition. Typically, a deposition masking device, or shadow frame, is placed about the periphery of the substrate to prevent processing gases or plasma from reaching the edge and backside of the substrate and to hold the substrate on a support member during processing. The shadow frame may be positioned in the processing chamber above the support member so that when the support member is moved into a raised processing position, the shadow frame is picked up and contacts an edge portion of the substrate. As a result, the shadow frame covers several millimeters of the periphery of the upper surface of the substrate, thereby preventing edge and backside deposition on the substrate.

With consideration of the benefits of using a shadow frame, there are a number of disadvantages with current shadow frame designs. Prior art shadow frames typically comprise clamping mechanisms that can have sharp corners. Such sharp corners can scratch or fracture substrates when brought into contact therewith such as during the loading and unloading of the substrate from the process chamber. Further, during processing, the substrate and the shadow frame experience expansion and contraction causing mechanical stress there between and often resulting in damage to the substrate. As such, the standard shadow frame may have a gap to separate it from the substrate.

When the shadow frame damages the substrate, arcing may occur. Arcing can cause damage to the susceptor, the substrate or other components of the chamber. Thus, there is a need in the art for an apparatus which prevents chipping and/or breaking of a substrate while simultaneously preventing arcing during processing.

SUMMARY OF THE INVENTION

The present invention generally relates to a shadow frame for use in a processing chamber, such as a PECVD chamber. In one embodiment, an apparatus for controlling deposition on a substrate is disclosed. The apparatus can include a chamber comprising a shadow frame support, a substrate support comprising a substrate supporting surface, and a shadow frame including a shadow frame body, a detachable lip and a support connection.

The shadow frame body can have a first support surface facing the substrate supporting surface and a second support surface opposite the first support surface. The detachable lip can be connected with the shadow frame body and fixably positioned on the second support surface. The detachable lip can have a first lip surface facing the substrate support, a second lip surface opposite the first lip surface, a first edge positioned over the first support surface, and a second edge opposite the first edge. The support connection can couple the shadow frame body to the detachable lip.

In another embodiment, an apparatus for controlling deposition on a substrate can include a chamber comprising a shadow frame support, a substrate support comprising a substrate supporting surface, and a shadow frame comprising a shadow frame body and a detachable lip which can rest on the substrate supporting surface.

The shadow frame body can include a first support surface facing the substrate supporting surface, wherein the first surface rests on the shadow frame support, a second support surface opposite the first surface comprising a recess with a lower recess surface and a recess ledge. The detachable lip can be connected with the shadow frame body and fixably positioned in the recess of the second support surface. The detachable lip can include a first lip surface facing the substrate, wherein a portion connects with the lower recess surface, a second lip surface opposite the first lip surface, a first edge positioned in connection with the recess ledge, and a second edge opposite the first edge.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present invention generally relate to a shadow frame for use in a processing chamber. In one or more embodiments described below, a shadow frame is formed of either a unibody or multi-piece shadow frame body which is connected with either a unibody or multi-piece detachable lip. The shadow frame design can permit arcing control by controlling the "gap" or distance between the shadow frame and the substrate during high power operations or for processes that typically result in arcing such as silicon nitride or silicon oxide based deposition processes. In absence of the lip, arcing could otherwise be possible between adjacent shadow frame pieces. Additionally, in absence of the lip, arcing could otherwise occur between the shadow frame and other chamber pieces.

Without intending to be bound by theory, it is believed that arcing is due in part to chipping or breaking of the substrate. It is important that a shadow frame make some contact with the substrate to prevent deposition under the shadow frame during processing. However, the weight of prior art shadow frames can lead to chips or cracks in the substrate. A chip or crack in the substrate exposes portions of the susceptor to plasma, thus creating a propensity for arcing. By the embodiments described here, the weight of the shadow frame supported on the surface is reduced and contact of the shadow frame with the substrate is controlled which minimizes chipping or breaking of the substrate. Therefore, embodiments described here can control deposition on the substrate while avoiding arcing due to breakage.

Further, the shadow frame enhances amorphous silicon uniformity because of the narrow edge lip and thus, less shadowing of the substrate. The uniform arrangement of the electrically insulating material also assists in amorphous silicon deposition uniformity. Embodiments of the invention are more clearly described with reference to the figures below.

Figure 1:
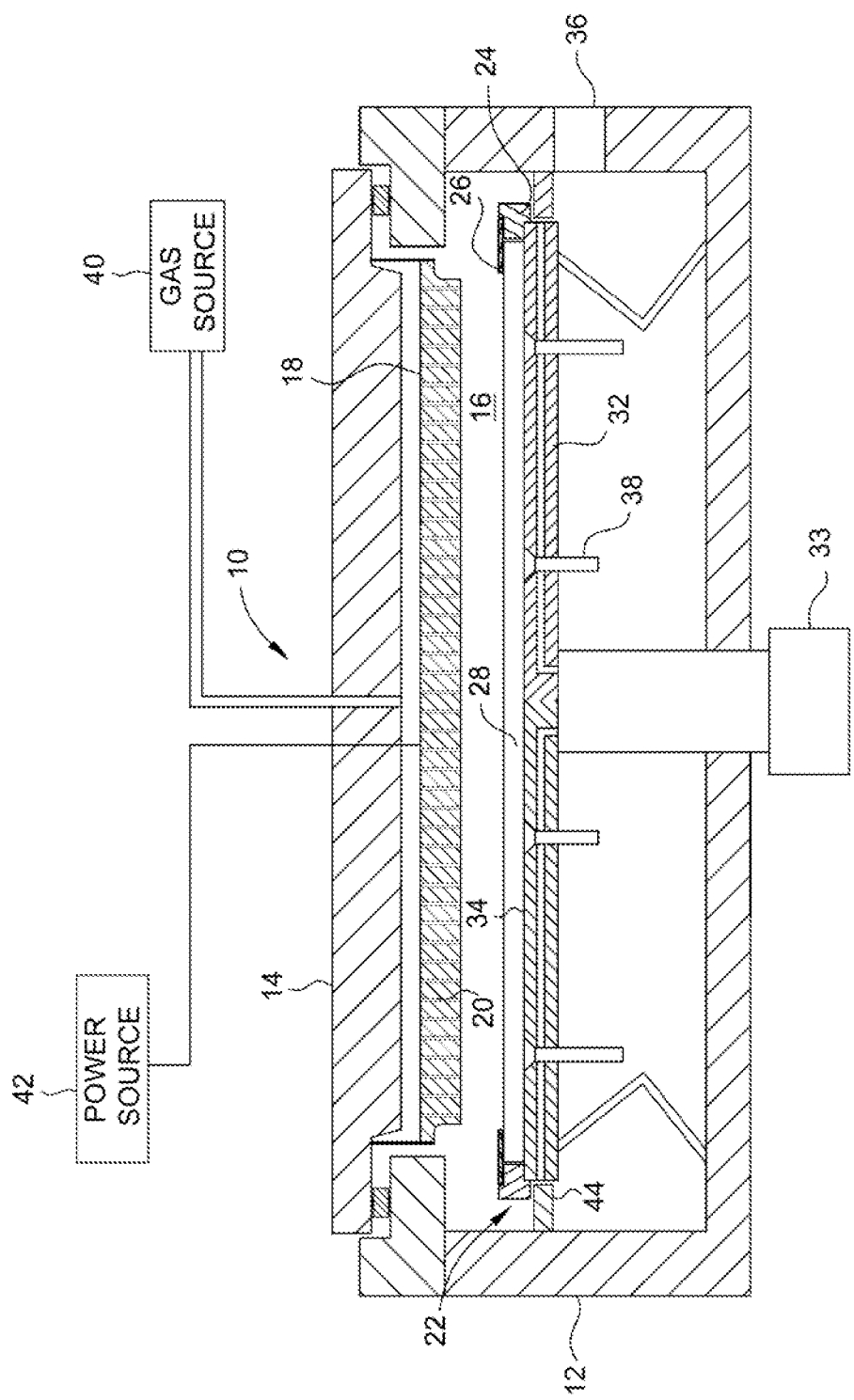
FIG. 1 is a schematic cross sectional view of a processing chamber.

FIG. 1 is a schematic cross sectional view of an exemplary processing chamber 10 with a shadow frame according to one embodiment. One example of the process chamber that may be adapted to benefit from the invention is a PECVD process chamber, available from AKT America, Inc, a subsidiary of Applied Materials, Inc., located in Santa Clara, Calif. It is contemplated that other plasma processing chambers, including those from other manufacturers, may be adapted to practice the present invention.

The processing chamber 10 comprises a chamber body 12 and a backing plate 14 disposed thereon. The chamber body 12 has a processing region 16. The dimensions of the chamber body 12 and related components of the processing chamber 10 are not limited and generally are proportionally larger than the size of a substrate 28 to be processed. Any suitable substrate size may be processed. Examples of suitable substrate sizes include substrate having a surface area of about 5500 centimeter square or more, such as about 25000 centimeter square or more, for example about 50000 centimeter square or more. In one embodiment, a substrate having a surface area of about 90000 centimeter square or more may be processed.

A gas distribution plate 18 can be mounted to the backing plate 14 and defines the upper boundary of the processing region 16. A plurality of holes 20 are formed in the gas distribution plate 18 to allow delivery of processing gases therethrough. A gas source 40 can deliver a gas to the plenum formed between the gas distribution plate 18 and the backing plate 14 so as to evenly distribute the processing gas and thus, uniformly deliver the processing gas through the gas distribution plate 18. A power source 42 may be electrically coupled to the gas distribution plate 18 so as to create a plasma from the processing gas that flows through the holes 20. The power source 42 can be any type of power source used in PECVD chambers, such as an RF power source. A shadow frame 22 is shown disposed on a substrate support 32. The shadow frame 22 includes a shadow frame body 24 with a detachable lip 26 affixed thereto.

The chamber body 12 also includes a shadow frame support 44 which is formed annularly around the substrate support 32. When the substrate support 32 is in a lowered position, the shadow frame 22 is supported by the shadow frame support 44.

The substrate support 32, also referred to as a susceptor or heater, is disposed in the processing chamber 10 and is actuated by a motor 33. In a raised processing position, the substrate support 32, having the substrate 28 disposed on a substrate supporting surface 34 thereof, supports the shadow frame body 24 of the shadow frame 22 and defines the lower boundary of the processing region 16 such that the substrate 28 is positioned in the processing region 16. The detachable lip 26 both extends over and contacts a portion of the substrate 28 while the shadow frame body 24 rests on the substrate supporting surface 34.

The substrate 28 is introduced into and removed from the processing chamber 10 through an opening 36 formed in the chamber body 12 which is selectively sealed by a slit valve mechanism (not shown). Lift pins 38 can be slidably disposed through the substrate support 32 and can be adapted to hold a substrate at an upper end thereof. The lift pins 38 can be actuatable by lowering the substrate support 32 using the motor 33.

Figure 2A:
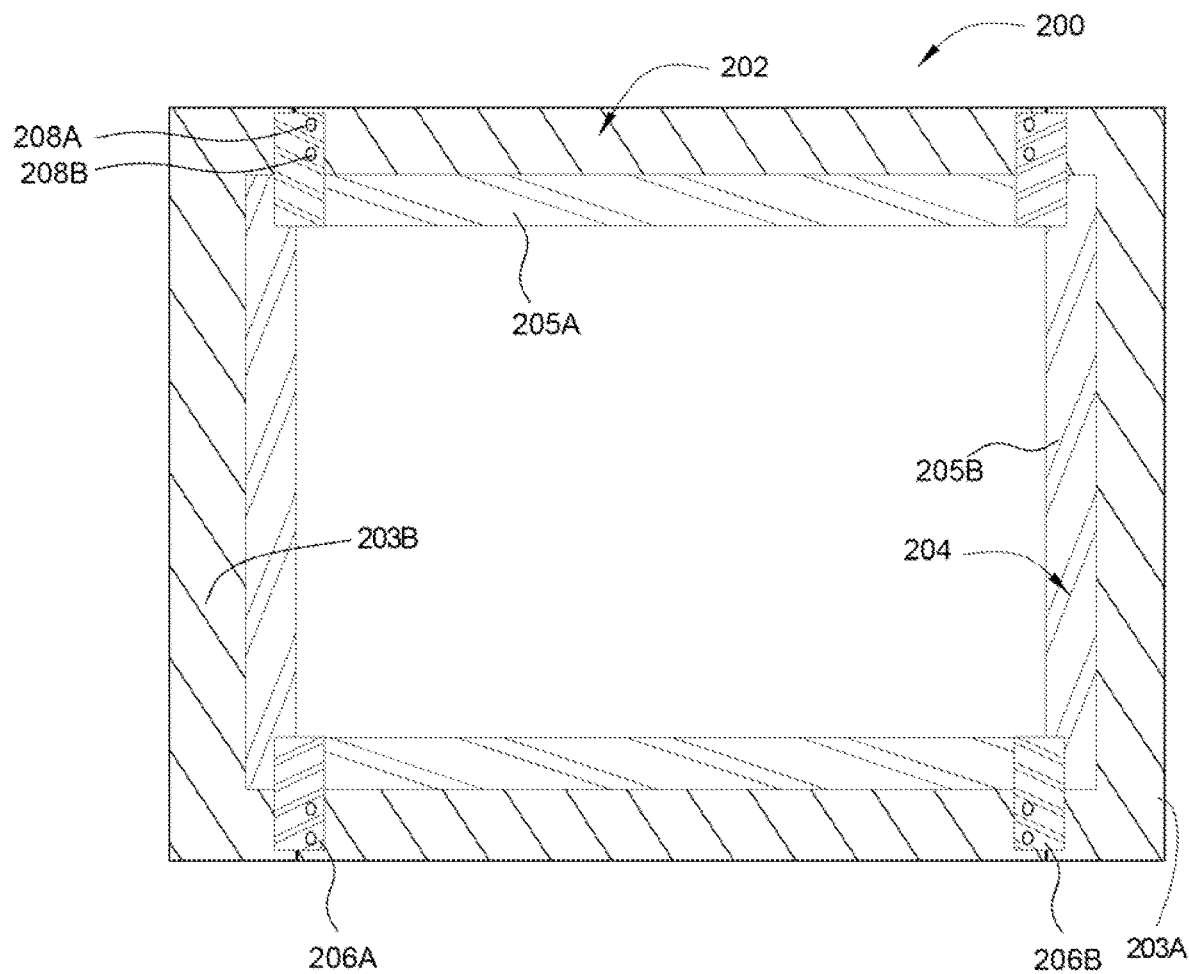
FIG. 2A is a schematic illustration of the shadow frame having a detachable lip coupled to the surface of the shadow frame body.

FIG. 2A is a schematic illustration of a shadow frame 200 having a detachable lip 202 coupled to a shadow frame body 204 according to one embodiment. The shadow frame body 204 can be composed of a plurality of shadow frame body pieces 203A, 203B. Though shown in the figure as a multiple piece structure, the shadow frame body 204 can be a unitary body shaped to accommodate a substrate (rectangular in the case of flat panel glass substrates). Further, the shadow frame 200 can be of any size or shape as user needs demand, such as a shadow frame designed for a 5500 cm$^2$ substrate.

The shadow frame body 204 may be fixably connected with the detachable lip 202. The detachable lip 202 can be composed of a plurality of detachable lip pieces 205A, 205B, however it is to be understood that the detachable lip 202 may comprise a unitary body. The shadow frame body pieces 203A, 203B may each be attached to the detachable lip pieces 205A, 205B. The detachable lip pieces 205A, 205B can overlap shadow frame body pieces 203A, 203B, thereby allowing the detachable lip pieces 205A, 205B to be connected with more than one shadow frame body piece 203A, 203B.

Gaps formed between the shadow frame body pieces 203A, 203B and the detachable lip pieces 205A, 205B can be sealed by one or more gap covers 206A and 206B. The gap covers 206A and 206B can be connected to the shadow frame body 204 using one or more support connections, depicted here as support connections 208A and 208B. The support connections described here are preferred embodiments. Further embodiments can use support connections which connect to, with or through other components of the shadow frame. The support connections used in this embodiment can be a bolt or a screw or other fastening mechanisms.

It is important to note that the gap covers 206A and 206B, depicted here as a device covering the gaps, are but one embodiment. Further gap covers can be integrated into the shadow frame body pieces 203A, 203B or the detachable lip pieces 205A, 205B, such as an overhang formed into one shadow frame body piece 203A which fits into a groove formed into a second shadow frame body piece 203B. Combinations of the above embodiments are also envisioned.

Figure 2B:
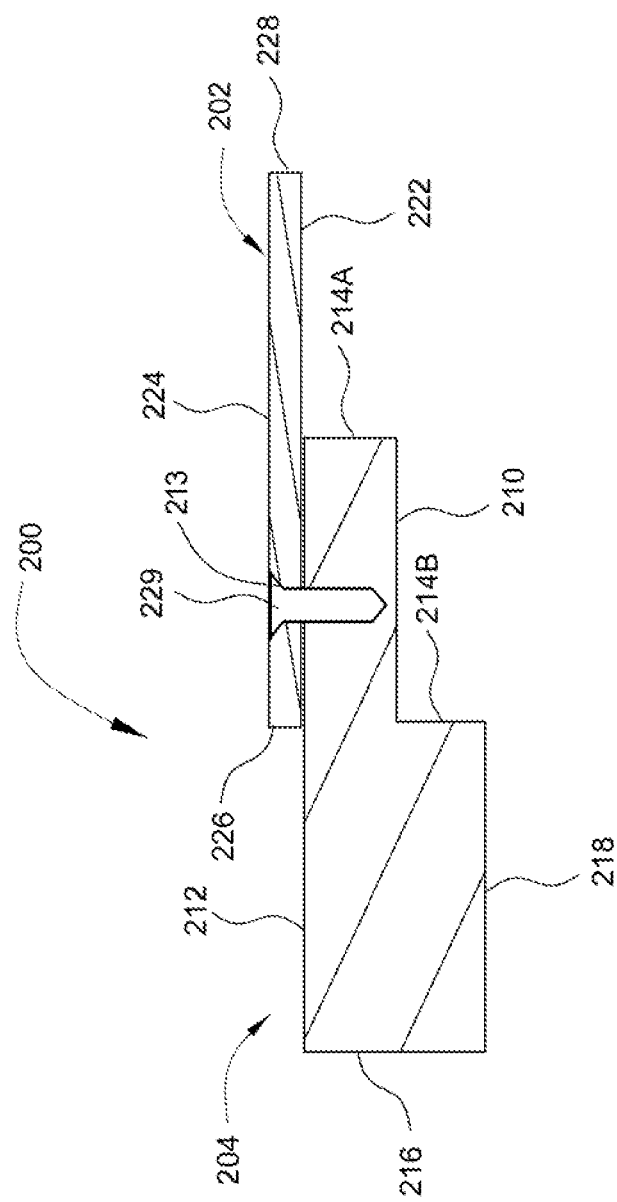
FIG. 2B is a schematic cross-sectional view of the shadow frame described in FIG. 2A.

FIG. 2B depicts a schematic cross-sectional view of the shadow frame 200 having the detachable lip 202 coupled to the shadow frame body 204 according to one embodiment. The shadow frame body 204 can have a first support surface 210, a second support surface 212, inside edges 214A and 214B, an outside edge 216 and a lower edge 218.

The first support surface 210 can face the substrate supporting surface and in fact rest on the substrate supporting surface during processing. The lower edge 218 rests on the shadow frame support when the shadow frame 200 is not supported by the substrate support. An example of the shadow frame support is a ledge that extends from a chamber wall.

The second support surface 212 can be positioned opposite the first support surface 210. In the embodiment shown in FIG. 2B, the surfaces 210 and 212 are substantially parallel. However, it is to be understood that the surfaces 210, 212 can be arranged to suit the needs of the shadow frame demand. The second support surface 212 can have structures formed in the surface, such as a hole 213, which can be used for receiving a fastening mechanism used to connect the detachable lip 202 to the shadow frame body 204.

The thickness of the shadow frame body 204 assures contact between the detachable lip 202 and the substrate without applying too much stress to either the substrate or the shadow frame body 204. The distance between the first support surface 210 and the second support surface 212 on the shadow frame body 204 (i.e., the length of inside edge 214A) should not be so thick as to position the detachable lip out of contact with the substrate, considering the position of the detachable lip 202 when attached to the shadow frame body 204. In one embodiment, the distance is substantially equal to the thickness of the substrate to be processed. In some embodiments, the distance between the first support surface 210 and the second support surface 212 is between about 6 mm and about 15 mm, such as a distance of about 10 mm. In the embodiment shown in FIG. 2B, the shadow frame body 204 is shown having an "L" shape so as to let the shadow frame body 204 rest on the substrate supporting surface while surrounding both the substrate and the substrate support on all sides.

The inside edges 214A and 214B can be positioned to provide proper spacing of the shadow frame body 204 from the substrate and the substrate support respectively. Without wishing to be bound by theory, it is believed that the damage caused to the substrate by the shadow frame body 204 can increase the likelihood of arcing between the susceptor and the shadow frame body 204 among other components. However, if the shadow frame body 204 is too far from the substrate, deposition may occur on the substrate under the shadow frame.

The outside edge 216 and the lower edge 218. The outside edge 216 and the lower edge can be substantially flat surfaces, as depicted in FIG. 2B as flat surfaces which meet at a 90 degree angle. Further embodiments can include different shapes or angles so as to accommodate the shadow frame support needs of the technician. The shadow frame body 204 can further be constructed of a metal, such as aluminum, anodized aluminum., ceramic, or a combination thereof.

The detachable lip 202 will generally comprise a ceramic. Using aluminum in the detachable lip creates the possibility of warping. In one embodiment, the detachable lip 202 is thinner than the shadow frame body 204. In some embodiments, the detachable lip can be between about 2 mm to about 10 mm thick, such as about 3 mm to about 5 mm thick. In one embodiment, the detachable lip 202 is composed of ceramic and is about 3 mm thick.

In the embodiment shown in FIG. 2B, the detachable lip 202 extends beyond the shadow frame body 204 and can cover a portion of an edge of the substrate. The detachable lip 202 can extend beyond the shadow frame body 204 by between about 25 mm and about 40 mm.

The detachable lip 202 can comprise a unitary body. The detachable lip 202 can have a first lip surface 222, a second lip surface 224, a first edge 226 and a second edge 228. A support connection 229 can be used to couple the detachable lip 202 to the shadow frame body 204.

The first lip surface 222 is arranged to face the substrate during processing and is in contact with second support surface 212. Further, at least a portion of the first lip surface 222 may be in contact with the substrate when the shadow frame 200 is positioned on the substrate support. The first lip surface 222 can be a substantially flat surface. Further embodiments can include surface texturing or other features to reduce the portion of the first lip surface 222 which may contact the substrate.

The second lip surface 224 is opposite the first lip surface 222. The second lip surface 224 can be substantially parallel to the first lip surface 222. Further embodiments include a second lip surface 224 which is formed at an angle with respect to the first lip surface 222, so as to create an angle. In one embodiment, the first lip surface 222 and the second lip surface 224 can create an angle of from about 3 degrees to about 7 degrees, such as an angle of about 5 degrees.

The first edge 226 connects the first and second lip surfaces 222, 224. Though depicted in FIG. 2B as being flat, the first edge 226 can be of a variety of shapes allowing the first edge 226 to fit securely in a groove, such as a curved or v shaped first edge fitting securely into curved or v-shaped recess ledge (not shown).

The second edge 228 is opposite the first edge 226. The second edge 228 connects the first and second lip surfaces 222, 224. Though depicted in FIG. 2B as a flat surface, the second edge 228 can be a variety of shapes to provide safer contact with the substrate or to reduce contact points, such as a rounded or tapered second edge.

The support connection 229 can securely connect the detachable lip 202 to the shadow frame body 204. The support connection 229 can be connected at a point where the detachable lip 202 and the shadow frame body 204 meet, such as near the first edge 226. Further, the support connection 229 can be a fixed connection, such as a latch, a groove or a screw. In the embodiment shown in FIG. 2B, the support connection 229 is depicted as a screw.

The support connection 229 can comprise materials such as aluminum, anodized aluminum, a ceramic, or other materials. The support connection 229 used in one embodiment may comprise the same material as either the shadow frame body 204 or the detachable lip 202. Further embodiments of the support connection 229 can include slidable grooves, latches, clasps or other fixed attachments which can securely hold the detachable lip 202 and the shadow frame body 204 together.

It is important to note that the shadow frame described here, need not be composed of a plurality of shadow frame body pieces and detachable lip pieces. The detachable lip and the shadow frame body may individually be a single unified structure. Any combination of the above may be used to form an embodiment of a shadow frame in accordance with the invention. For example, a unified shadow frame body can connect to a plurality of detachable lip pieces comprising a portion of a shadow frame.

Without intending to be bound by theory, it is believed that the use of a detachable lip by one or more of the designs described here will allow for a better deposition profile at the edges. Due to turbulent gas flow, prior art designs have seen a gradual slant in the direction of the shadow frame, thus creating a non-uniform thickness of a deposited layer over the surface of a substrate. The embodiments described here create a more uniform deposition profile. With a more uniform deposition profile, devices can be formed closer to the edge of the substrate thus leading to more device on the substrate and less waste of substrate space during processing.

FIGS. 3A-3D are schematic cross-sectional views showing various embodiments of a shadow frame using the detachable lip design. The portions of the embodiments described below can be used alone or in combination to achieve contact with the surface of the substrate without damaging the substrate during processing.

Figure 3A:
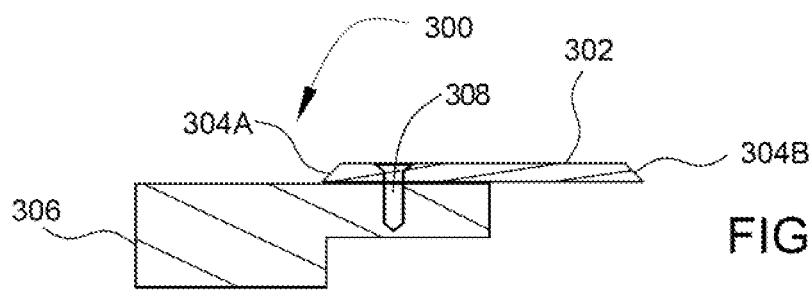
FIGS. 3A-3D are schematic cross-sectional views showing various embodiments of the shadow frame.

FIG. 3A depicts a shadow frame 300 with a tapered detachable lip 302. The shadow frame 300 can have a detachable lip 302 with tapered edges 304A and 304B. The tapered edges 304A and 304B can create a lower profile for the deposited film. Though the detachable lip 302 in this embodiment is shown with two tapered edges, it is not required that both edges be tapered. The detachable lip 302 can be securely connected to an upper surface of a shadow frame body 306. The detachable lip 302 can be connected using a support connection, depicted here as a screw 308. The support connection can be selected so as to be easily removable.

Prior art shadow frames have a relatively high critical thickness for the portion of the shadow frame that extends over the substrate, called a lip. This is because if the lip is damaged during operation, the entire shadow frame would need to be replaced, leading to unwanted downtime as well as a high cost for replacement. A removable connection can allow for secure positioning of the detachable lip 302 on the substrate as connected to the shadow frame body 306. Further, the detachable lip 302 can be easily removed and replaced in case of damage.

Figure 3B:
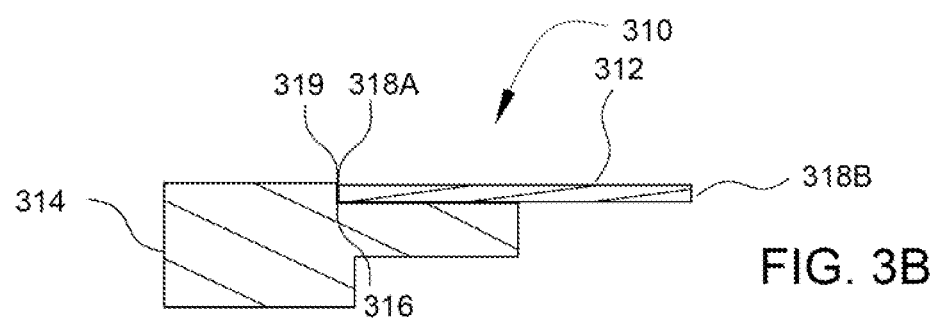

FIG. 3B depicts a shadow frame 310 with a recess 316 supporting a detachable lip 312. In this embodiment, the detachable lip 312 maintains a substantially similar width as the detachable lip 312 extends out from the shadow frame body 314. As discussed earlier, the detachable lip 312 may be extremely thin, such as between about 1 mm and about 3 mm, so as to produce a desirable film profile. The detachable lip 312 can be securely connected to an upper surface of a shadow frame body 314. The detachable lip 312 can be connected using a removable means such as a screw or a clamp. Some embodiments can use a permanent or semi-permanent connection, such as welding.

The detachable lip 312 can have flat edges 318A and 318B. The flat edge 318A can be substantially similar to a recess ledge 319 of the recess 316. The flat edge 318B can extend out over the substrate (not shown). The recess 316 formed in the surface of the shadow frame body 314, as disclosed in this embodiment, can provide both additional support for the detachable lip 312 and an additional measure to prevent flow under the detachable lip 312. As well, by reducing the surface area of the detachable lip 312 available to the plasma, damage to the detachable lip 312 during normal operation can be reduced. In the embodiment shown in FIG. 3B, the upper surface of the detachable lip 312 is substantially aligned with the topmost surface of the shadow frame body 314.

Figure 3C:
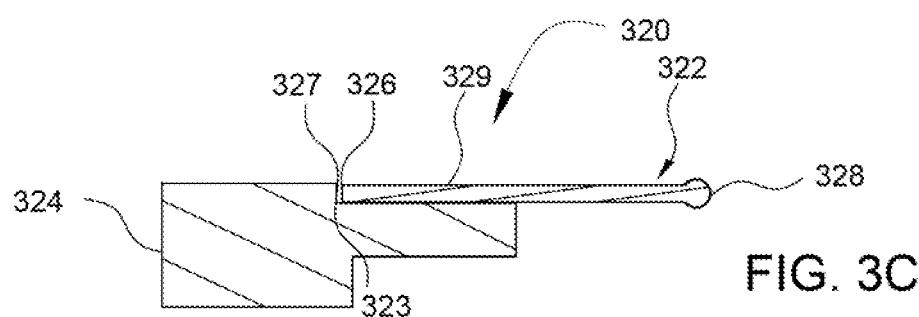

FIG. 3C depicts a shadow frame 320 with a recess 323 supporting a detachable lip 322 according to a further embodiment. In this embodiment, the detachable lip 322 maintains a substantially similar width as it extends out from the shadow frame body 324. As discussed earlier, the detachable lip 322 may be extremely thin so as to produce a desirable film profile. The detachable lip 322 can be securely connected to an upper surface of a shadow frame body 324. The detachable lip 322 can be connected using a removable means such as a screw or a clamp.

The detachable lip 322 can have a detachable lip body 329 and a flat edge 326. The flat edge 326 can be substantially similar to a recess ledge 327 of the recess 323. As well, the flat edge 326 can rest securely against the recess ledge 327 preventing pivoting movement of the portion of the detachable lip 322 which rests against the shadow frame body 324. The detachable lip 322 can also have a rounded edge 328. The rounded edge 328 can be completely rounded and be positioned so as to share a bisecting line with the detachable lip body 329. Further embodiments include the rounded edge 328 with only partial rounding, such as the rounded edge 328 with only the surface facing the substrate is rounded. In one embodiment, the rounded edge is either partially or completely rounded with a bisecting line shifted toward the substrate (not shown).

Figure 3D:
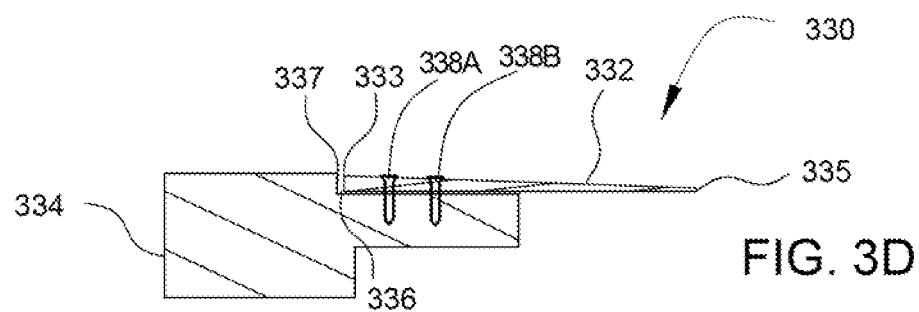

FIG. 3D depicts a shadow frame 330 with a recess 336 supporting a detachable lip 332 according to a further embodiment. In this embodiment, the detachable lip 332 reduces in width as it extends out from the shadow frame body 324 creating an angled edge 335. The angled edge 335 can be a variety of angles based on the needs of the user such as a 2 degree angle formed between the first lip surface and the second lip surface, as measured from the substrate side of the detachable lip 332. The detachable lip 332 can be securely connected to an upper surface of a shadow frame body 334. Further embodiments can have the angled edge 335 with an angle of 1 degree or less to allow the detachable lip 332 to extend further over the substrate while the detachable lip 332 remains either equal to or less than the height of the top surface of a recess 336 of the shadow frame body 334.

The detachable lip 332 can have a flat edge 333. The flat edge 333 can be substantially similar to a recess ledge 337 of the recess 336. As well, the flat edge 333 can rest securely against the recess ledge 337 preventing pivoting movement of the portion of the detachable lip 332 which rests against the shadow frame body 334. The detachable lip 332 can also have multiple support connections, depicted here as a two screws 338A and 338B.

Though the embodiments described here depict a generally straight body of the detachable lip, further embodiments can have a curved body or form various shapes as the viewed from a two dimensional profile. For example, a detachable lip may extend at a curvature from the shadow frame body to contact the substrate. Further embodiments may have one or more bends in the detachable lip so as to allow a first edge of the detachable lip to begin higher than the surface of the substrate. The detachable lip would then have one or more bends in the detachable lip body so as to bring the second edge in contact with the substrate.

Figure 4:
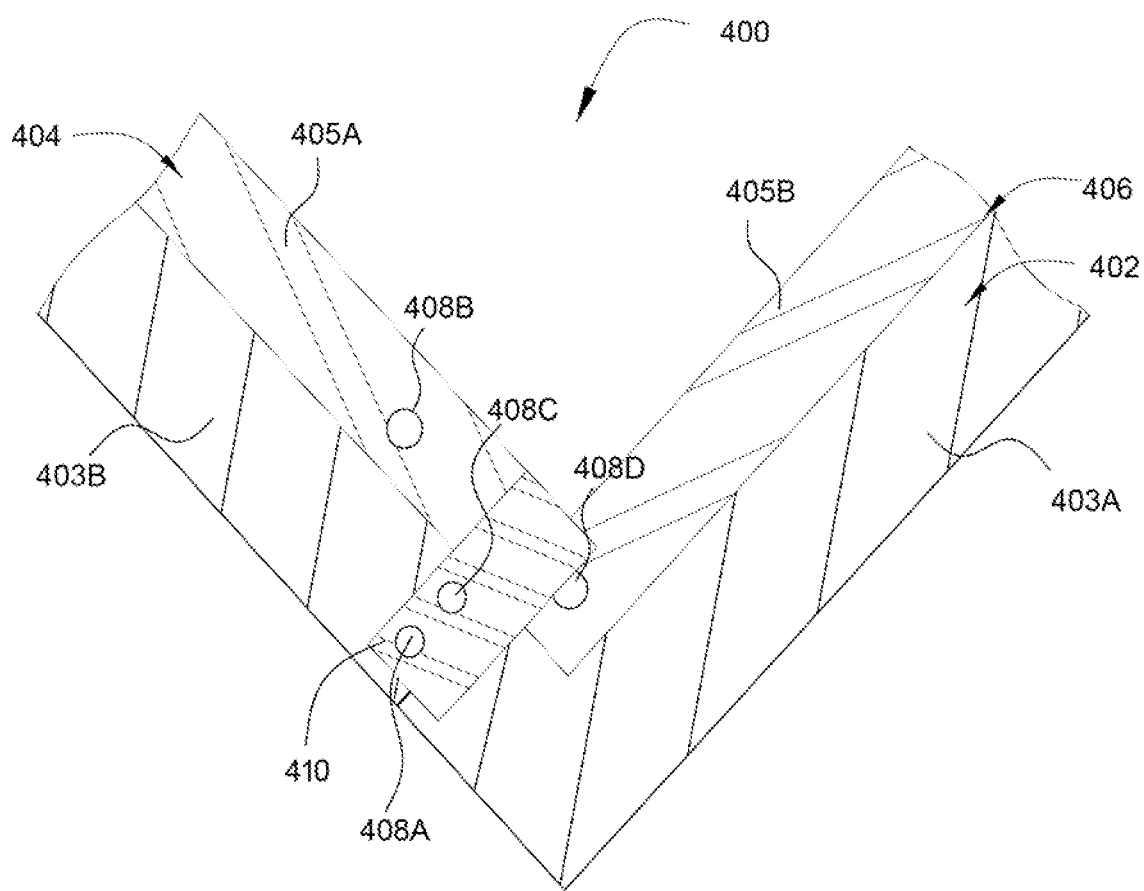
FIG. 4 is a schematic top view showing the detachable lip that covers a gap between adjacent shadow frame pieces.

FIG. 4 is a schematic top view showing the detachable lip that covers a gap between adjacent shadow frame pieces. The shadow frame 400 can have a shadow frame body 402 with one or more shadow frame body pieces 403A, 403B which can be of different lengths and shapes so that the shadow frame body 402 matches the size and shape of the substrate that it circumscribes.

The detachable lip 404 can comprise a plurality of detachable lip pieces 405A and 405B, which can have dimensions which extend beyond the shadow frame body pieces 403A, 403B. As such, the detachable lip pieces 405A, 405B, when securely attached, may hold the shadow frame body pieces 403A, 403B together and reduce gap width between pieces.

The detachable lip 404 can fit into a recess 406. The recess 406 can be composed of multiple recesses, such as those formed in the shadow frame body pieces 403A and 403B. As the shadow frame body pieces 403A, 403B and detachable lip pieces 405A, 405B are combined, gaps of some size may exist between the detachable lip pieces 405A, 405B individually and the shadow frame body pieces 403A, 403B individually. One or more gap covers 410 may be used to cover the gaps between these pieces. Though only one gap cover 410 is shown in this embodiment, it is envisioned that a gap cover can correspond to each gap formed in the shadow frame 400 from the detachable lip pieces 405A, 405B and the shadow frame body pieces 403A, 403B.

The gap cover 410 can be secured to the shadow frame body pieces 403A, 403B which have corresponding connection points 408A and 408C, depicted here as holes. Connection points 408A and 408C can be formed through the shadow frame body pieces 403B and the gap covers 410 allowing support connections, such as screws or bolts, to pass through. Connection points 408B and 408D can be can be formed through the detachable lip pieces 405A, 405B and the shadow frame body pieces 403A, 403B so as to connect the detachable lip pieces 405A, 405B with the shadow frame body pieces 403A, 403B. The connection points 408A-408D of the upper most members, shown in embodiments herein as either being the shadow frame body pieces 403A, 403B, the detachable lip pieces 405A, 405B, or the gap covers 410, can have beveled edges allowing the support connections to be recessed into the upper most piece.

Embodiments described herein generally relate to a shadow frame for use in a processing chamber. The shadow frame is composed of either a single member or multiple member shadow frame body which supports either a single member or multi member detachable lip. The detachable lip may include varying shapes and can use light weight materials. The multi piece detachable lip or multi piece shadow frame body embodiments include gap covers to seal gaps between pieces. The detachable lip is capable of contacting the substrate without cracking or breaking the substrate, thereby allowing the shadow frame to be used in high energy plasma operations without arcing while providing a good profile of deposited film on the substrate. Further, the detachable lip of the shadow frame is easily replaceable allowing for damaged detachable lips to be interchanged at a lower cost and with higher frequency.

While the foregoing is directed to embodiments of the present invention, other and further embodiments of the invention may be devised without departing from the basic scope thereof, and the scope thereof is determined by the claims that follow.

The invention claimed is:

1. An apparatus for controlling deposition on a substrate comprising:
   a chamber;
   a substrate support disposed within the chamber, the substrate support comprising a substrate supporting surface; and
   a shadow frame comprising:
     a shadow frame body comprising two or more shadow frame body pieces coupled together and having a first support surface facing the substrate supporting surface and a second support surface opposite the first support surface, the second support surface having a recess formed therein;
     a detachable lip connected with the shadow frame body and fixably positioned on a lower surface of the recess, the detachable lip comprising two or more detachable lip pieces coupled together and having a support surface edge positioned over the recess, a substrate facing edge positioned over a portion of the substrate supporting surface of the substrate support, a first lip surface facing the substrate support, and a second lip surface opposite the first lip surface, wherein:
       a thickness of the detachable lip at the support surface edge is equal to or less than the depth of the recess, and
       the thickness of the detachable lip reduces from the support surface edge to the substrate facing edge;
     one or more gap covers, wherein each gap cover seals a gap between adjacent shadow frame body pieces, a gap between adjacent detachable lip pieces, and a gap between the adjacent shadow frame body pieces and the adjacent detachable lip pieces; and
     one or more support connections formed through the shadow frame body and the one or more gap covers, the one or more support connections connecting the one or more gap covers to the shadow frame and the detachable lip to the shadow frame.

2. The apparatus of claim 1, wherein the thickness of the detachable lip is between about 2 mm and about 5 mm.

3. The apparatus of claim 1, wherein the substrate facing edge is an angled edge.

4. The apparatus of claim 1, wherein an angle between the first lip surface and the second lip surface at the substrate facing edge is between 1 and 2 degrees.

5. The apparatus of claim 1, wherein the support surface edge is a flat edge, the flat edge configured to rest against a ledge of the recess.

6. The apparatus of claim 1, wherein the shadow frame body comprises a material selected from the group consisting of ceramic, aluminum, anodized aluminum and a combination thereof.

7. The apparatus of claim 1, wherein the one or more support connections are flexible connections to allow for thermal expansion.

8. An apparatus for controlling deposition on a substrate comprising:
   a chamber comprising a shadow frame support;
   a substrate support disposed within the chamber and comprising a substrate supporting surface; and
   a shadow frame comprising:
     a shadow frame body comprising two or more shadow frame body pieces coupled together and having:
       a first support surface facing the substrate supporting surface;

a second support surface opposite the first support surface, the second support surface having a recess formed therein, the recess having:
   a lower recess surface; and
   a recess ledge; and
   an inside edge;
a detachable lip connected with the shadow frame body and fixably positioned in the recess of the second support surface, the detachable lip comprising two or more detachable lip pieces coupled together and having:
   a first lip surface facing the substrate supporting surface of the substrate support, wherein a portion of the first lip surface connects with the lower recess surface;
   a second lip surface opposite the first lip surface;
   a support surface edge positioned adjacent the recess ledge;
   a substrate facing edge opposite the support surface edge and positioned over the substrate supporting surface of the substrate support, wherein:
      the substrate facing edge is rounded, and
      a height of the support surface edge is equal to or less than a height of the recess ledge,
one or more gap covers, wherein each gap cover seals a gap between adjacent shadow frame body pieces, a pap between adjacent detachable lip pieces, and a pap between the adjacent shadow frame body pieces and the adjacent detachable lip pieces; and
one or more support connections formed through the shadow frame body and the one or more gap covers, the one or more support connections connecting the one or more gap covers to the shadow frame and the detachable lip to the shadow frame.

9. The apparatus of claim 8, wherein the shadow frame body comprises a material selected from the group consisting of ceramic, aluminum, anodized aluminum and a combination thereof.

10. The apparatus of claim 8, wherein the one or more support connections are flexible connections to allow for thermal expansion.

11. The apparatus of claim 8, wherein the thickness of the detachable lip is between about 2 mm and about 5 mm.

12. A shadow frame comprising:
a shadow frame body comprising two or more shadow frame body pieces coupled together and having a first support surface and a second support surface opposite the first support surface;
a detachable lip connected with the shadow frame body and fixably positioned on the second support surface, the detachable lip comprising two or more detachable lip pieces coupled together and having a first lip surface facing the second support surface, and a second lip surface opposite the first lip surface;
one or more gap covers, wherein each gap cover seals a gap between adjacent shadow frame body pieces, a gap between adjacent detachable lip pieces, and a gap between the adjacent shadow frame body pieces and the adjacent detachable lip pieces; and
one or more support connections formed through the shadow frame body and the one or more gap covers, the one or more support connections connecting the one or more gap covers to the shadow frame and the detachable lip to the shadow frame.

13. The shadow frame of claim 12, wherein thickness of the detachable lip is between about 2 mm and about 5 mm.

14. The shadow frame of claim 12, wherein the shadow frame body comprises a material selected from the group consisting of ceramic, aluminum, anodized aluminum and a combination thereof.

15. The shadow frame of claim 12, wherein the one or more support connections are flexible connections to allow for thermal expansion.

\* \* \* \* \*

UNITED STATES PATENT AND TRADEMARK OFFICE
CERTIFICATE OF CORRECTION

PATENT NO.        : 10,676,817 B2
APPLICATION NO.   : 13/569064
DATED             : June 9, 2020
INVENTOR(S)       : Qunhua Wang et al.

It is certified that error appears in the above-identified patent and that said Letters Patent is hereby corrected as shown below:

In the Claims

In Column 11, Line 26, in Claim 8, delete "pap" and insert -- gap --, therefor.

In Column 11, Line 27, in Claim 8, delete "pap" and insert -- gap --, therefor.

Signed and Sealed this
Fourth Day of August, 2020

Andrei Iancu
*Director of the United States Patent and Trademark Office*